(12) United States Patent
Bohley

(10) Patent No.: US 6,573,733 B2
(45) Date of Patent: Jun. 3, 2003

(54) CAPACITANCE MEASURING TECHNIQUE FOR ESTIMATING CABLE LENGTH

(75) Inventor: Thomas K. Bohley, Colorado Springs, CO (US)

(73) Assignee: Fluke Corporation, Everett, WA (US)

( * ) Notice: Subject to any disclaimer, the term of this patent is extended or adjusted under 35 U.S.C. 154(b) by 25 days.

(21) Appl. No.: 09/779,084

(22) Filed: Feb. 8, 2001

(65) Prior Publication Data

US 2002/0105344 A1 Aug. 8, 2002

(51) Int. Cl.⁷ ............................................... C01R 27/26
(52) U.S. Cl. ........................ 324/658; 324/676; 324/678; 324/519
(58) Field of Search ........................ 324/67, 519, 522, 324/533, 662, 681, 676, 713, 66, 525, 527, 534, 539, 621, 628, 642, 643, 647, 658, 673, 754; 379/21, 24, 30; 73/291

(56) References Cited

U.S. PATENT DOCUMENTS

| | | | | |
|---|---|---|---|---|
| 4,103,225 A | * | 7/1978 | Stephens | 324/678 |
| 5,339,022 A | * | 8/1994 | Fleming et al. | 324/67 |
| 5,600,248 A | * | 2/1997 | Westrom et al. | 324/522 |
| 6,008,654 A | * | 12/1999 | Chaskell | 324/519 |
| 6,060,890 A | * | 5/2000 | Tsinker | 324/676 |
| 6,144,721 A | * | 11/2000 | Stephens | 379/21 |
| 6,226,356 B1 | * | 5/2001 | Brown | 379/24 |
| 2002/0158637 A1 | * | 10/2002 | Warmack et al. | 324/601 |

OTHER PUBLICATIONS

"Sensors Handbook", by Sabrie Soloman, McGraw–Hill, 1999, ISBN 0–07–059630–1.*

* cited by examiner

Primary Examiner—N. Le
Assistant Examiner—Walter Benson
(74) Attorney, Agent, or Firm—Dellett & Walters

(57) ABSTRACT

A hand held test instrument measures cable lengths by applying a square wave signal to a conductor of a pair and detects the induced current in the other conductor of the pair. A synchronous detector measures the induced current, which is representative of the capacitance of the cable, which is representative of the length of the cable.

13 Claims, 4 Drawing Sheets

CAPACITANCE MEASURING TECHNIQUE FOR ESTIMATING CABLE LENGTH

BACKGROUND OF THE INVENTION

This invention relates to test and measurement instruments, and more particularly, to methods and apparatus for estimating cable length.

In the past, time domain reflectometry (TDR) has been used to determine cable lengths. However, the computations required for TDR are complex, and the TDR process requires a fair amount of power. Such power requirements are disadvantageous in certain situations, for example, when a battery powered/small size test instrument is desired. To overcome these issues with TDR measurement techniques, capacitance measurements have been used in test instruments to estimate the length of a cable under test. For example, it has been known to employ a sinusoidal excitation voltage and measurement of current to accomplish the measurement. However, in such a method, series resistance in the measurement circuits must be compensated for. When testing or measuring certain types of circuits, overload protection is necessary, to protect the instrument from damage in the event of connection with an excessive voltage. The overload protection adds series resistance that must be compensated for. Further, to accomplish the measurement, the frequency of the sinusoid must be known, and the voltage level must be controlled.

SUMMARY OF THE INVENTION

In accordance with the invention, cable lengths are determined by measurement of the capacitance of the cable. A square wave signal is applied to one conductor on the cable, and current is measured on the other conductor. The signal change gives the capacitance with enables determination of the cable length.

Accordingly, it is an object of the present invention to provide an improved capacitance measurement technique for determining cable length that does not require compensation for series resistance.

It is a further object of the present invention to provide an improved measurement technique for cable length that is adapted for portable or battery powered instruments.

It is yet another object of the present invention to provide an improved cable length measurement device that does not require compensation for measurement circuit resistance.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of the present invention comprises a hand-held network test instrument. The instrument is adapted for insertion inline between a network and a device hooked to the network. Various tests and inquiries are made by the instrument and reported to a user, in a manner to enable even a user relatively unfamiliar with the inner workings of a network to trouble-shoot the network and the devices hooked thereto.

Figure 1:
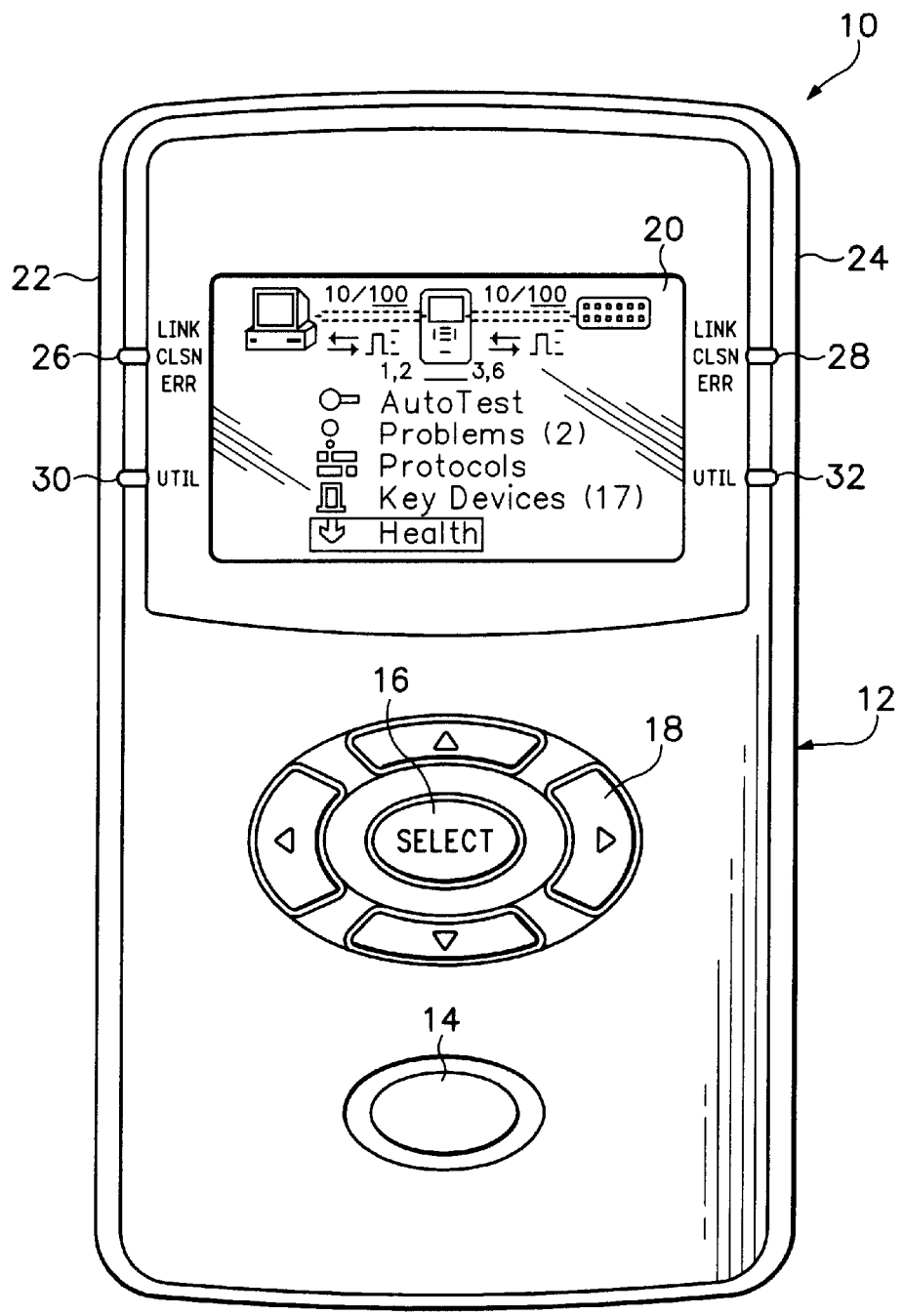
FIG. 1 is a view of a hand held instrument according to the invention.

Referring to FIG. 1, a view of a hand-held network test instrument 10 according to the invention, the test instrument comprises a somewhat rectangular case 12, with a power switch 14 positioned near a lower end of the case, centered with respect to left and right sides of the case. Positioned above power switch 14 is a select key 16 centered within a "ring" of navigation keys 18. In the preferred embodiment, there are 4 navigation keys, to provide leftward, rightward, upward and downward navigation functionality. All of the above mentioned keys and switches are located below the top-to-bottom center line of the case. Above the center line is a display 20, suitably a backlit LCD display. Left and right connectors 22 and 24 are provided at left and right sides of the case, suitably comprising RJ45 female connectors, to interface to network cables having corresponding connectors attached thereto, for example, via connection with cables having corresponding male RJ45 connectors. The top ⅓ of display 20 is suitably aligned with the left and right connectors, to provide a physical association with the information displayed thereon and the two connectors 22, 24. An enhanced graphic sensation of the inline aspect of the device is thereby provided to the user.

At the left and right edges of the test instrument case, adjacent the connectors 22, 24, are provided link/collision/error indicators 26, 28. Immediately therebelow are positioned left and right utilization indicators 30, 32. Suitably, indicators 26, 28, 30 and 32 comprise tri-color LEDs, indicators 26 and 28 representing link (green), collisions (yellow) and errors (red). Indicators 30 and 32 suitably represent utilization. In the preferred embodiment, indicators 30 and 32 are driven green to show a utilization of less than 40%, yellow to represent a utilization of 40% to 70%, and red to show utilization over 70%.

Figure 2:
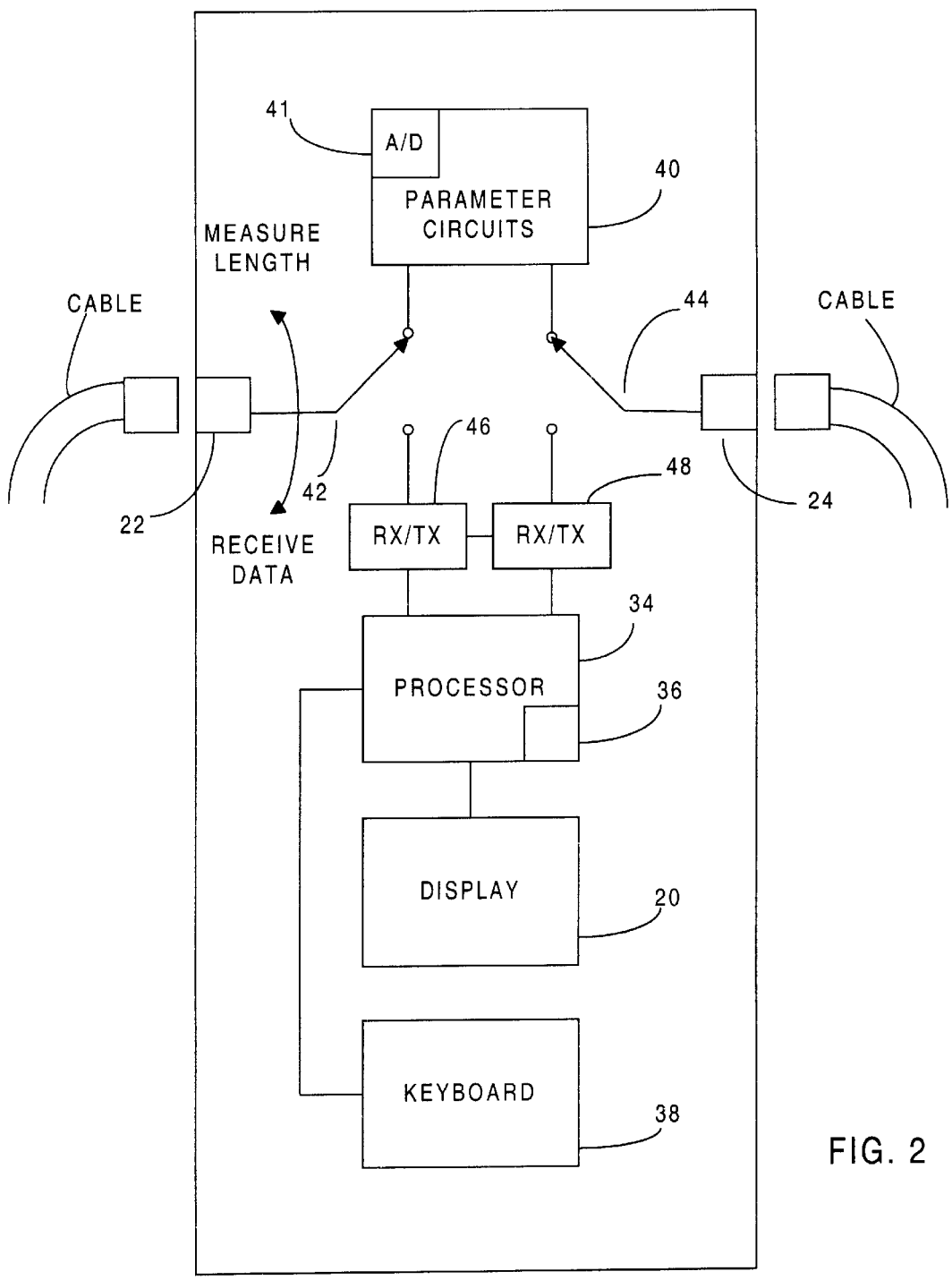
FIG. 2 is a block diagram of a measurement instrument.

Referring to FIG. 2, a block diagram of the measurement instrument according to the present invention, the instrument 10 includes a processor 34 for driving operation thereof and memory 36, which can include RAM, ROM, PROM, etc. Keyboard 38 (which includes input keys 16 and 18) interfaces to the processor, for interpretation of actuation of the various keys. Processor 34 may suitably comprise hardware, software, or combinations thereof. Display 20 (and indicators 26, 28, 30 and 32) are also suitably interfaced with and driven by the processor. A parameter measurement circuit 40, which also may suitably include an Analog to Digital Converter (ADC) 41, is provided and may be selectively connected to network connector 22 by switch 42 and/or to network connector 24 by switch 44. Switch 42 also may be alternatively selected to a receive/transmit (Rx/Tx) interface 46 which is connected to the processor, for transmitting and receiving data via connector 22. Similarly, switch 44 may also be alternatively selected to connect to a receive/transmit interface 48 which is also connected to the processor and to network connector 24. The two receive/transmit interfaces 46 and 48 are also suitably connected to each other.

In operation, the switches 42 and 44 are actuated under control of the processor to either have one or both of the receive/transmit interfaces connected to their respective network connectors 22 and 24, or to have the parameter circuits 40 connected to one or both of the network connectors. Thus, the instrument can send and receive data on a network via the connectors, or, can perform certain length measurements via the parameter circuits 40, as will be further discussed hereinbelow.

Figure 3:
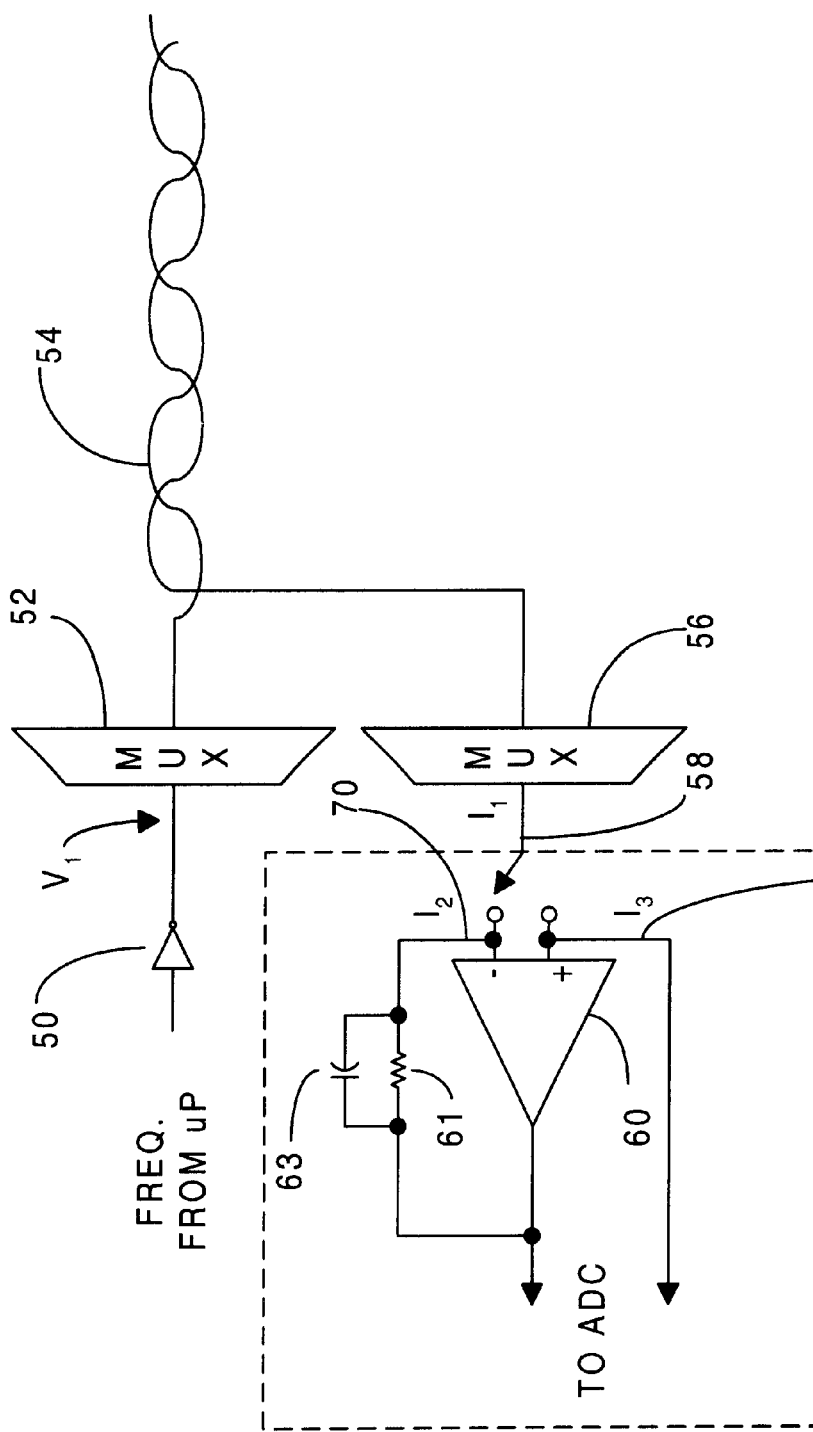
FIG. 3 is a detailed diagram of the length measurement circuit of the instrument of FIG. 2.

Referring to FIG. 3, which is a more detailed diagram of some of the components of parameter circuit 40 of FIG. 2 that provide length measurement capability, an input from the microprocessor provides a signal of a frequency to an inverter 50, which provides a square wave output to a multiplexer 52. The multiplexer supplies the square wave output to a wire of selected wire pair 54. Operation of switches 42 and 44 will determine to which network connector the signal will go. A second multiplexer 56 receives return current pulses from the cable under test on the other wire of the selected wire pair 54, the output of the multiplexer 56 being supplied to a switch 58 which selectively connects the multiplexer to either the non-inverting (+) or inverting (−) input of an amplifier/low-pass filter 60. The non-inverting input of amplifier/low-pass filter 60 is also supplied to the Analog to Digital Converter 41 (FIG. 2). The output of amplifier/low-pass filter 60 is fed back to the inverting input thereof via the parallel combination of resistor 61 and capacitor 63. The output of amplifier/low-pass filter 60 is also provided to the Analog to Digital Converter. The switch 58 and amplifier/low-pass filter 60, resister 61, capacitor 63 and their configuration together comprise a synchronous detector 68.

In operation, one wire pair 54 of a cable under test is selected via multiplexer 52 (suitably, a network cable connected to the instrument will have multiple pairs, and the multiplexer 52 provides the capability to separately test multiple pairs). One of the wires is driven with a square wave voltage (illustrated as $V_1$ 62 in FIG. 4), thereby inducing a displacement current in the second wire of the pair. The induced current $I_1$ is illustrated by waveforms 64 and 66 of FIG. 4, wherein the difference in the two waveforms is discussed below. The induced current is passed by multiplexer 56 to the synchronous detector 68, producing a voltage that is sent to an analog to digital converter. The signal is directly proportional to the capacitance between the two wires of the pair, which is directly proportional to the length of the wire pair. The voltage from the analog to digital converter is multiplied by a calibration factor, thereby converting the voltage to a cable length (suitably displayed in feet or meters, as desired). The length of the wire pair is thereby determined.

The accuracy of the measurement is dependent on the frequency of the square wave, the amplitude of the square wave, the accuracy of resistor 61 and the accuracy of the analog to digital converter. Since the microprocessor employs an accurate crystal for timing, and the amplitude of the square wave is derived from the analog to digital converter reference, the accuracy is not dependent on the reference voltage. Resistor 61 is suitably a precision resistor so the measurements are highly accurate and repeatable.

Figure 4:
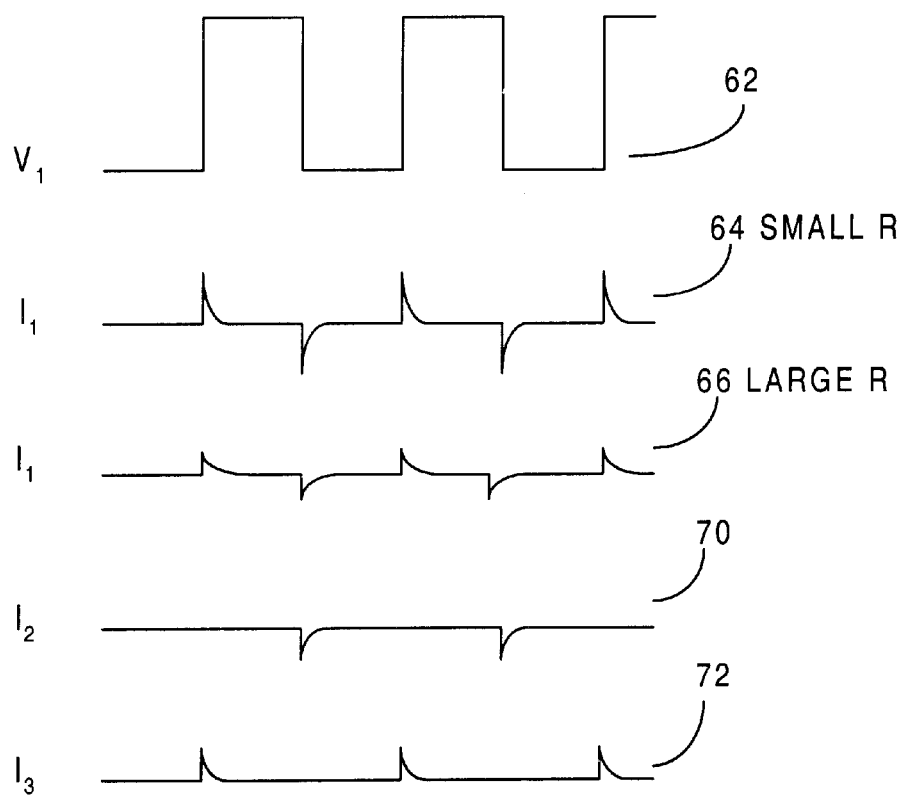
FIG. 4 is a diagram of waveforms appearing at certain points within the circuits of the instrument during operation of the instrument.

Referring to FIG. 4, the effect of series resistance on the measurement is illustrated by the wave forms in FIG. 4. In the test instrument, the series resistance contribution is mainly from the multiplexers and from protection circuitry to protect the instrument from over load inputs. As the series resistance gets larger (wave form 66 of FIG. 4) the current pulses returned spread out in time. However, the area of a selected pulse, which is equal to the charge in Coulombs, does not change. Since the charge of each of the pulses and the number of pulses in a given unit of time determines the output of the synchronous detector 68, the detector output does not change with a change in series resistance. Therefore, a capacitive cable length measurement is provided without requiring compensation for the series resistance of the signal path in the measurement instrument.

An advantage provided by the instrument according to the invention is that the use of the synchronous detector rejects a lot of noise, providing noise immunity to the measurement device. Since cabling environments are varied and may be high noise, this noise immunity is desirable.

Referring still to FIG. 4, a diagram of wave forms that would be observed at various points in the circuit of FIG. 3, wave form 64, represents the current induced in the second wire of the pair for a small series resistance, while wave form 66 represents the current induced in the second wire of the pair for a larger series resistance. Wave form 62 is the square wave driven to the wire pair, while waveforms 70 and 72 represent the current inputs to the inverting and non-inverting inputs of the amplifier/low-pass filter 60.

The frequency input to inverter 50 may be varied to provide optimum testing for different cable lengths. Typically, shorter cables are tested employing higher frequencies. The frequency input square wave is precisely controlled, by a crystal oscillator, for example, suitably the oscillator employed by the microprocessor 34.

The operation and timing of the instrument is directed by the processor 34, which interacts with the user via the display and keyboard to select and run tests on cables which may be attached to connectors 22 and 24. The cables under test are typically network cables and the like, such as multiple twisted pair cables employed in local area networks. The instrument is implemented in the preferred embodiment as a hand held device, powered by batteries for example.

Thus, according to the invention, a hand held instrument is provided that is capable of noise immune cable length measurements without requiring compensation for the series resistance within the instrument.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. An apparatus for determining the length of a cable under test, comprising:
    a signal generator for generating and applying a signal to the cable under test;
    a detector for receiving a return current signal from the cable under test and producing a rectified averaged voltage output representative of the cable length.

2. An apparatus for determining the length of a cable under test according to claim 1, further comprising an analog to digital converter receiving the output from said detector, for providing a digital representation of the cable length.

3. An apparatus for determining the length of a cable under test according to claim 1, wherein the signal generator generates a square wave signal.

4. An apparatus for determining the length of a cable under test according to claim 3, wherein the signal generator comprises an inverter driven by a clock signal.

5. An apparatus for determining the length of a cable under test according to claim 1, further comprising a multiplexer for directing the signal to a selected wire of the cable under test.

6. An apparatus for determining the length of a cable under test according to claim 1, further comprising a multiplexer for selectively connecting a selected wire of the cable under test to the detector.

7. An apparatus for determining the length of a cable under test according to claim 1, wherein said detector comprises a synchronous detector.

8. An apparatus for determining the length of a cable under test according to claim 7, wherein said synchronous detector comprises:

an amplifier having an inverting input, a non-inverting input, and an output, and a switch, wherein said switch alternately connects the return current signal from the cable under test to the inverting and non-inverting inputs.

9. An apparatus for determining the length of a cable under test according to claim 8, wherein said synchronous detector further comprises a parallel capacitive/resistive feedback from the output to the inverting input thereof.

10. A test instrument for determining the length of a cable under test, wherein the cable under test has plural conductor pairs, comprising:

a first multiplexer having an output coupled to the cable under test for selecting a first conductor of a first conductor pair, a second multiplexer having an input coupled to the cable under test for selecting a second conductor of the first conductor pair, a signal generator coupled to an input of said first multiplexer, said signal generator for generating a square wave signal to apply to the cable under test via said first multiplexer;

a detector coupled to the output of said second multiplexer for receiving a return current signal from the second conductor of the first conductor pair of the cable under test, said detector producing a rectified averaged voltage output representative of the cable length.

11. A test instrument for determining the length of a cable under test according to claim 10, further comprising a variable frequency control for altering the frequency of the square wave signal generated by said signal generator.

12. A test instrument for determining the length of a cable under test according to claim 10, further comprising an analog to digital converter for generating a digital representation of the rectified averaged voltage output.

13. A test instrument for determining the length of a cable under test according to claim 10, wherein said detector comprises a synchronous detector.

* * * * *